United States Patent
Ivanov

(10) Patent No.: US 6,638,856 B1
(45) Date of Patent: *Oct. 28, 2003

(54) METHOD OF DEPOSITING METAL ONTO A SUBSTRATE

(75) Inventor: Ivan Petrov Ivanov, Burnsville, MN (US)

(73) Assignee: Cypress Semiconductor Corporation, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/151,475

(22) Filed: Sep. 11, 1998

(65) Prior Publication Data (65)

(51) Int. Cl.[7] ................................................. H01L 21/44
(52) U.S. Cl. ....................... 438/656; 438/688; 438/687
(58) Field of Search ................................ 438/656, 660, 438/685, 686, 687, 688, 795, 799, 643

(56) References Cited

U.S. PATENT DOCUMENTS

| | | | |
|---|---|---|---|
| 4,962,060 A | | 10/1990 | Sliwa et al. |
| 4,970,176 A | | 11/1990 | Tracy et al. |
| 5,047,358 A | | 9/1991 | Kosiak et al. |
| 5,108,570 A | | 4/1992 | Wang |
| 5,270,255 A | * | 12/1993 | Wong .......................... 438/643 |
| 5,288,665 A | | 2/1994 | Nulman |
| 5,302,266 A | | 4/1994 | Grabarz et al. |
| 5,371,042 A | | 12/1994 | Ong |
| 5,378,660 A | | 1/1995 | Ngan et al. |
| 5,434,044 A | | 7/1995 | Nulman et al. |
| 5,443,995 A | | 8/1995 | Nulman |
| 5,523,259 A | * | 6/1996 | Merchant et al. ........... 438/643 |
| 5,539,255 A | | 7/1996 | Cronin |
| 5,691,571 A | * | 11/1997 | Hirose et al. ................ 257/751 |
| 5,985,759 A | * | 11/1999 | Kim et al. ................... 438/653 |

OTHER PUBLICATIONS

Uehara et al., "A Novel Local Interconnect Technology (MSD) for High–Performance Logic LSIs with Embedded SRAM", 1996 Symposium on VLSI Technology Digest Of Technical Papers, pp 142–143.

Miyamoto, Masafumi, "High Speed And Low–Power Interconnect Technology For Sub–Quarter Micron ASICS", IEEE Transactions On Electron Devices, vol. 44, No. 2, Feb. 1997, pp. 250–256.

(List continued on next page.)

*Primary Examiner*—Carl Whitehead, Jr.
*Assistant Examiner*—Thanh Nguyen
(74) *Attorney, Agent, or Firm*—Piper Rudnick LLP; Steven B. Kelber

(57) ABSTRACT

A method for depositing a metal layer on a substrate includes the steps of depositing a first metal layer at a first deposition temperature; depositing a second metal layer on the first metal layer at a second deposition temperature higher than the first deposition temperature; reducing at least one of a growth rate and a temperature of at least the second metal layer; and depositing a third metal layer on the second metal layer. Preferably, the growth rate is reduced substantially to zero and the temperature is reduced to a point below which the second metal layer ceases to flow. By interrupting the processing the metal layer prior to the third metal layer forming step by the reducing and/or cooling step, the formation of whiskers and other similar thermal stress-induced defects is suppressed or inhibited, resulting in a substantially smooth and substantially defect free metal layer.

3 Claims, 3 Drawing Sheet

OTHER PUBLICATIONS

Xu, Zheng, "Planar Multilevel Metallization Technologies for ULSI Devices", SPIE vol. 2335, pp. 70–79.

Santoro, C.J., "Thermal Cycling and Surface Reconstruction in Aluminum Thin Films", J. Electrochem Soc: Solid State Science, vol. 116, No. 3, Mar. 1969.

Shibata, Hideki, et al., "The Effects of Al(111) Crystal Orientation On Electromigration in Half–Micron Layered Al Interconnects", Jpn. J. Appl. Phys. vol. 32 (1993) P. 1 No. 10 pp. 4479–3384.

Voutsas, Apostolos T. et al., "Structure Engineering For Hillock–Free Pure Aluminum Sputter Deposition For gate And Source Line Fabrication In Active–Matrix Liquid Crystal Displays", J. Vac. Sci. Technol. A 16(4), Jul./Aug. 1998, pp. 2668–2677.

Xu, Zheng et al. "Al Planarization Process For Multilayer Metallization of Quarter Micrometer Devices", Thin Solid Films 253 (1994), pp. 367–371.

Robinson, Gail, "Al Hits sub–0.25 Micron Vias", Electronic Engineering EE Times, Issue 939, Feb. 3, 1997.

VLSI Technology, International Edition 1988, by S.M.Sze, "*Physical Vapor Deposition*" pp.: 386–391.

* cited by examiner s

METHOD OF DEPOSITING METAL ONTO A SUBSTRATE

BACKGROUND OF THE INVENTION

1. Field of the Invention

This invention relates to the formation of a metal layer on a substrate. More particularly, the present invention relates to the formation of defect free or substantially defect free metal layers in an integrated circuit.

2. Description of the Related Art

Defects incident to the deposition or formation of metal layers on a substrate of, for example, an integrated circuit decrease the reliability of the resulting device, decrease the production yield and increase costs. Some defects, variously known as whiskers, spikes, hillocks or nails (hereafter collectively referred to as whiskers), have been observed incident to the formation of aluminum containing metal alloys, among others. Whiskers often manifest themselves as three-dimensional projections or non-uniformities in the deposited or formed metal layer. Conventionally, Chemical Vapor Deposited (CVD) W-plug is used to fill vias and contacts to connect different metals levels in IC designs. After this step, Chemical Mechanical Polishing (CMP) must be used to remove the W from the entire wafer surface. However, CMP techniques can add many steps to the semiconductor manufacturing process, and are poorly controlled. Thus, CMP has not proven to be an entirely successful method of overcoming the effects of such whiskers and other unwanted topographic defects on the surface of metal layers.

CMP has not always been necessary to correct problems associated with whiskers, as the size of some whiskers and other like defects has not always necessitated its use. Indeed, in defects of small size, the presence of such whiskers may not appreciably affect either the function of the devices or the overall yield of the process. However, as line widths decrease below about 0.50 microns, for example, the size of such whiskers often becomes an appreciable fraction of the line width and may, in fact, be of a size that interferes with the proper functioning of the semiconductor device.

Such a situation is depicted in FIG. 3. As shown in FIG. 3, semiconductor devices often include a plurality of electrical conductors, such as conductors 310. When a defect, such as a whisker 320 is of a size that is comparable to the width of and/or the distance between adjacent conductors (the pitch), the whisker may create an unwanted electrical pathway between two or more adjacent conductors, causing at least a partial short. The whiskers are believed to be single crystals in structure, formed as an extrusion of a1, for example, as a result of compressive-stress generated secondary nucleation. These whiskers are embedded into the film have different etch rate and serve as bridges in the form of "nails" after the metal lines are formed.

Whiskers are a common problem in at least aluminum layers and in aluminum containing metal layers. Considering now FIG. 1, a method of depositing an e.g., aluminum layer within, for example, a high aspect ratio via, includes a first step of depositing an adhesion layer onto a silicon substrate. The adhesion layer may include titanium, for example, and the deposition process may include collimating of the titanium source to insure uniform step coverage of the adhesion layer within high aspect ratio vias, as shown in FIG. 1 at step S0. As shown in step S1, a first metal layer may be deposited at a relatively low temperature, followed by a "hot" second metal layer deposition step at a relatively higher temperature, as shown in step S2. Finally, a so-called "cap" layer may be formed, at a relatively high temperature and power, as shown at steps S3. The high deposition temperature of step S2 allows the deposited metal to flow easily into, for example, high aspect ratio vias and other like structures. Therefore, to flow easily into high aspect ration vias, the e.g., aluminum or aluminum-containing alloy must be deposited close to its critical ratio of growth or deposition temperature versus melting point. A critical ratio of unity means that the growth or deposition temperature is equal to the melting point of the metal to be deposited or grown. To fill such high aspect ratio vias requires the metal to be deposited or grown at a critical ratio that is somewhat close to unity. The deposited metal, under the described conditions, is allowed to flow into vias, contacts and trenches, i.e., the temperature should be at least higher than that required to cause plastic deformation of the "hot metal".

Investigations into the physical phenomena behind the formation of whiskers and other similar defects have led to a belief that such defects may be due to the relaxation of compressive and tensile forces within the aluminum or other metal layer formed or deposited by such a regime. Indeed, because the aluminum may be in a highly compressive state, due primarily to high temperature and/or high growth rate, a secondary nucleation phenomenon may occur in which secondary nuclei may form to release some of the compressive forces, which secondary nuclei have a much faster growth rate than the surrounding layer or layers. Such secondary nucleation may be at least one of the root causes of the formation of whiskers, and other similar defects. Other models point to grain boundary diffusion as the primary whisker formation mechanism and predict lower whisker density in strongly oriented aluminum films.

Various methods have been proposed to reduce the occurrence of such whiskers, but none are believed to effectively address the problem without, however, adding a plurality of additional unwanted steps to the process, increasing the cost of the resultant devices, increasing processing time and/or decreasing the yield of the process. What are needed, therefore, are methods for depositing a metal layer or layers on a substrate that do not suffer from performance or yield degrading whiskers and like defects, or methods that at least decrease the occurrence and/or size of such whiskers and other similar defects. What are also needed are methods for depositing a metal layer(s) onto a substrate that minimize the number of additional steps that must be carried out to achieve a defect-free or substantially defect free metal layer on a substrate, such as a semiconductor substrate.

SUMMARY OF THE INVENTION

An object of the present invention, therefore, is to provide methods for depositing a metal layer or layers on a substrate that do not suffer from performance or yield degrading whiskers and like defects, or methods that at least decrease the occurrence and/or size of such whiskers and other similar defects. Another object of the present invention is to provide methods for depositing a metal layer(s) onto a substrate that minimize the number of additional steps that must be carried out to achieve a defect-free or substantially defect free metal layer on a substrate, such as a semiconductor substrate.

In accordance with the above-described objects and those that will be mentioned and will become apparent below, a method depositing a metal layer onto a substrate, according to an embodiment of the present invention, comprises the steps of depositing a first metal layer at a first deposition temperature;

depositing a second metal layer on the first metal layer at a second deposition temperature higher than the first deposition temperature;

reducing at least one of a growth rate and a temperature of at least the second metal layer; and depositing a third metal layer on the second metal layer.

According to other embodiments, a step of depositing an adhesion layer on the substrate before the first metal layer is deposited may also be carried out. The first, second and/or the third metal layers may include one or more of the following elements: aluminum, copper, tungsten, molybdenum, tantalum, titanium and alloys thereof. The second temperature may be sufficient to allow the second metal layer to flow into high aspect ratio vias. The second temperature may be selected so that a ratio of the second temperature to a melting temperature of the second metal is between about 0.65 and about 0.95. The reducing step may reduce the growth rate substantially to zero. The temperature in the reducing step may be reduced to below about 400° C. Alternatively, the temperature in the reducing step may be reduced to below about 250° C. The reducing step may be carried out by removing the first and second metal layers from a process chamber in which the second metal depositing step is carried out.

According to another preferred embodiment, a method of forming a metallization layer on a substrate, according to the present invention, comprises the sequential steps of:

forming a first metal layer on the substrate at a first temperature in a first process chamber;

forming a second metal layer on the first metal layer at a second temperature in the first process chamber;

moving the substrate to a second process chamber for a period of time sufficient to inhibit a formation of defects upon subsequent formation of a third metal layer; and forming a third metal layer on the second layer.

According to further embodiments, the second process chamber may be at a third temperature, the third temperature being lower than the second temperature. The third metal layer may be formed at a higher power than is used to form the second metal layer and the third metal layer may be formed at a fourth temperature, the fourth temperature being lower than the second temperature. A step of returning the substrate to the second chamber prior to the third metal layer forming step may also be carried out. The heater within the second chamber may be turned off prior to the third metal layer forming step.

The present invention may also be viewed as a method of forming a substantially smooth and substantially defect free metal layer, comprising the steps of:

forming a first metal layer;

forming a second metal layer on the first metal layer at a temperature wherein a critical ratio of deposition temperature to melting temperature is between about 0.65 to about 0.95 stopping the second metal layer forming step and cooling the first and second metal layers to a temperature below which the second metal layer ceases to flow; and forming a third metal layer on the second metal layer at a temperature wherein the critical ratio is below about 0.65.

According to other preferred embodiments, the first, second and/or third metal layers may include one or more elements selected from the group consisting of aluminum, copper, tungsten, molybdenum, tantalum, titanium and alloys thereof The stopping and cooling step may be carried out by removing the first and second metal layers from the location where they were formed. The third metal layer forming step may be carried out in the location where the first and second metal layers were formed. The first, second and third metal layers may include aluminum, and the second temperature may be selected between about 450° C. to about 500° C.

BRIEF DESCRIPTION OF THE DRAWINGS

For a further understanding of the objects and advantages of the present invention reference should be made to the following detailed description, taken in conjunction with the accompanying figures, in which.

DESCRIPTION OF THE PREFERRED EMBODIMENTS

As used herein, the phrases "metal layer", "metal film", "metallization layer" and the like refer to a layer of metal or a stack of such metal layers, without regard to the relative magnitudes of the dimensions of the metal formation (i.e., the term "metal layer" or "metal film" is not intended to be restricted by the connotation associated with the words "layer" or "film"). For example, in a semiconductor device, a metal layer may include, for example, an electrically conductive trace formed of a metal, an electrically conductive ground or power plane formed of metal, or an electrically conductive contact (i.e., a filled via) formed of metal. The metallization layer may be formed by any conventional process, such as by sputtering, plasma and/or deposition by a chemical vapor deposition technique.

Figure 1:
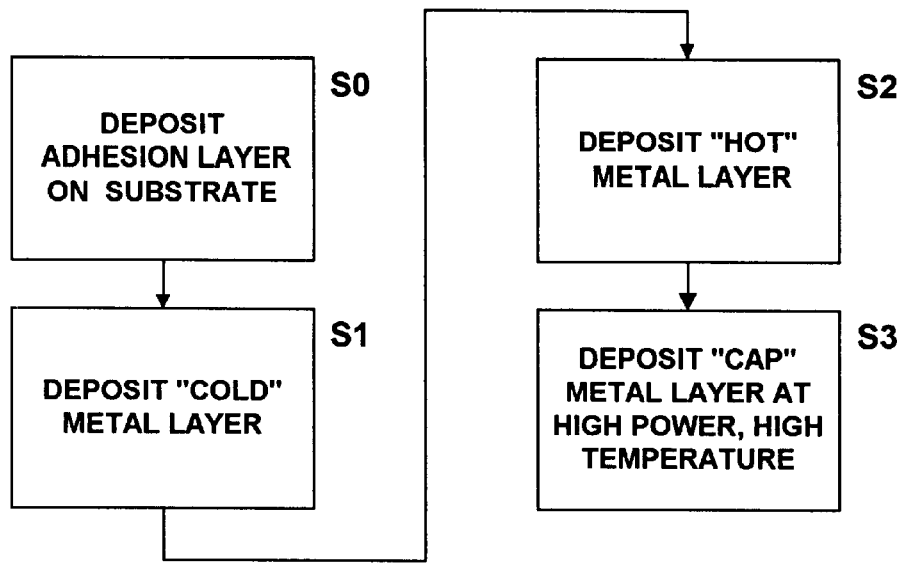
FIG. 1 shows a method of depositing a metal layer on a substrate.
Figure 2:
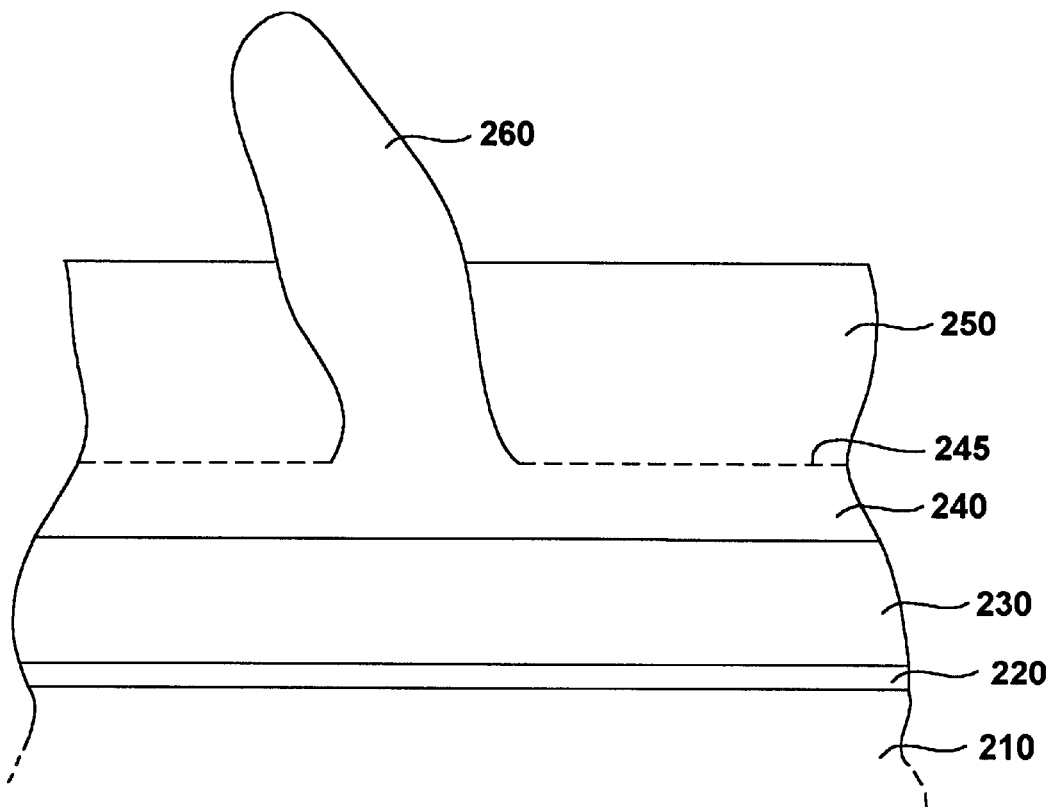
FIG. 2 shows a cross section of the metal stack with a whisker embedded in it with the approximate place of origination.
Figure 3:
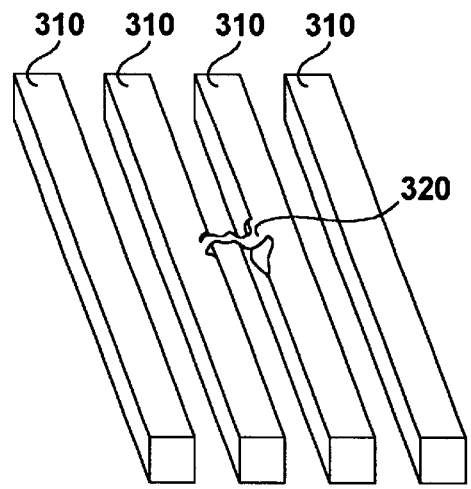
FIG. 3 shows an example of a whisker or whisker defect shorting two conductors of a semiconductor device.

Novel investigations into the formation of whiskers in thin metal films has brought evidence to light that the majority of whiskers are formed during the formation of the last, so-called "cap" layer of FIG. 1. Reference is now made to FIG. 2, which shows a metal layer 230–250 on a substrate 210. An adhesion layer that may include, for example, a collimated titanium layer 220, may be formed on a substrate, such as an $SiO_2$ substrate 210. A first layer of metal, such as aluminum or an aluminum-containing alloy 230 is formed on the collimated titanium layer 220 at a relatively low temperature. A second layer of metal, such as aluminum or an aluminum-containing alloy 240 is formed on the layer 230. Finally, a "cap" third metal layer 250 of, for example, aluminum or aluminum-containing alloy, is formed at a somewhat reduced temperature and at high power. It has been found, according to the present invention, that whiskers such as whisker 260 form primarily at the boundary 245 between the second metal layer 240 and the "cap" third metal layer 250.

Figure 4:
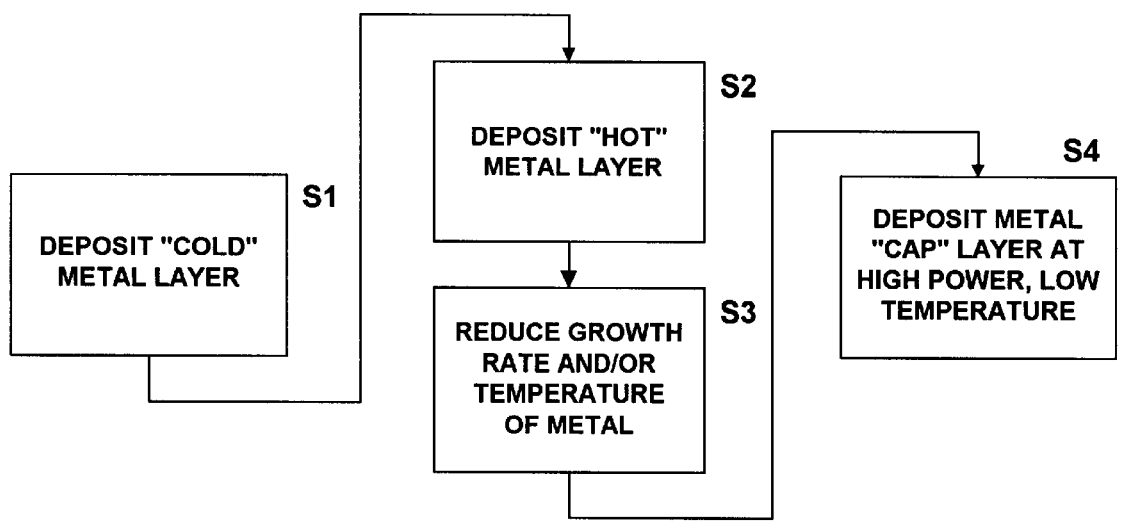
FIG. 4 shows an embodiment of the method according to the present invention.

An embodiment of the method of depositing a metal layer onto a substrate according to the present invention is shown at FIG. 4. In step S1, a cold first metal layer is deposited on the substrate. The first metal layer may include aluminum or an aluminum-containing layer. For example, the first metal layer of step S1 may be deposited at a temperature ranging from about room temperature to about 300° C. Preferably, the first metal layer is deposited at a temperature within the range of about 50° C. and about 200° C. For example, the first metal layer may be aluminum, or an aluminum alloy containing, for example, 0.5% of copper and deposited at a temperature of about 100° C.

In cases wherein the substrate is $SiO_2$, an adhesion layer, including for example, titanium, may be deposited on the substrate prior to the deposition of the first metal layer. Depositing such an adhesion layer may be necessary to allow adequate coverage of the first metal layer, as the thermal expansion coefficients of the substrate and the first metal layer may be very dissimilar. The adhesion layer may be deposited through a collimating grating, to insure good and uniform coverage of the adhesion layer within and at the bottom of high aspect ratio vias, for example.

In step S2, a "hot" second metal layer is deposited onto the first metal layer of step S1. The deposition temperature of the second metal layer is relatively higher than the temperature at which the first metal layer was deposited in step S1. In other words, the critical ratio of deposition temperature to melting temperature for the selected second metal layer is closer to unity than the critical ratio of the first metal layer deposited in step S1. For example, the second metal layer may have substantially the same composition as the first metal layer and may be deposited at a temperature ranging from about 350° C. to about 550° C., in the case wherein the first and second metal layers include aluminum. Preferably, the second metal layer is deposited at a temperature ranging from about 400° C. to about 500° C. For example, the second metal layer may be deposited at a temperature of about 480° C. To do this, backside gas pressure may be applied on the pedestal on which the wafer rests, thereby causing the surface temperature of the wafer to rise rapidly.

Thereafter, as shown in step S3, instead of proceeding directly with the deposition of the "cap" third metal layer, as shown in step S4, an intermediate step is introduced, according to the present invention. According to step S3, the growth rate and/or the temperature of at least the second layer is reduced. Indeed, the present invention is at least partly predicated upon the finding that the generation of whiskers and other similar defects is a strong function of temperature and a relatively weaker function of deposition rate. Therefore, according to the present invention, the generation of whiskers and other similar defects will be minimized by reducing the deposition rate and/or the temperature. Doing so will reduce the occurrence of whiskers at the boundary of the second layer and the "cap" third metal layer to be deposited onto the second metal layer. To reduce the growth rate and/or temperature of the second metal layer, the entire wafer may be cooled by turning off or reducing the backside gas pressure on the pedestal supporting the wafer within the process chamber, thereby reducing the thermal conductance between the wafer backside and the pedestal. Other methods of reducing the growth rate and/or temperature are possible. For example, one possible method of reducing the generation of whiskers and other similar defects, according to another embodiment of the present invention, is to entirely stop the deposition of the second metal layer instead of, for example, merely increasing the power within the chamber to rapidly create the "cap" third metal layer. This reduces the generation of whiskers, albeit to a lesser degree than manipulation of the temperature allows. More preferably, the growth rate of the second metal layer is reduced to zero and the ambient temperature is reduced to below about 250° C. More preferably still, the growth rate of the second metal layer is reduced to zero and the wafer's temperature is reduced to below about 150° C. For example, the growth rate of the second metal layer may be reduced to zero and the ambient temperature may be reduced to a temperature within the range of about 50° C. to about 100° C.

Returning to FIG. 4, after the growth rate and/or the temperature of the second metal layer has been reduced according to the present invention, a third metal layer, a so-called "cap" layer, may be deposited on the second layer, preferably at high power and at a lower temperature than the temperature in step S2.

It has been found that step S3; namely, the step of reducing the growth rate and/or the temperature prior to depositing the third metal layer greatly reduces the generation of defects, such as whiskers and other similar undesirable phenomena. Best results will be obtained when the growth rate is reduced to zero and the temperature is reduced to below about 250° C.

The first, second and third metal layers may include aluminum or an aluminum containing alloy, such as an aluminum alloy containing 0.5% of a metallic impurity, such as copper for example. Other metallic impurities may be added to the aluminum-containing alloy in place of or in addition to copper, to produce ternary, quaternary or higher order compounds. In addition, the percentage of impurity may be varied within the context of the present invention as long as the alloy utilized maintains the desirable electrical characteristics.

Although several embodiments of the present invention have been disclosed relative to aluminum and aluminum-containing alloys as the first, second and third metal layers, the invention may also be adapted to metals other than aluminum and aluminum containing alloys. For example, the invention is believed to be applicable to such metals as copper, tungsten, molybdenum, tantalum, titanium and alloys thereof. Indeed, it is believed that such metals also exhibit similar compressive and tensile stresses as does aluminum during high temperature deposition or formation. Such compressive and tensile stresses may also cause the formation of defects such as whiskers and other similar defects, as the lattice structure of the metal may not allow the growth of a secondary nucleation therein. As the only outlet to relieve the stress of such compressive and tensile forces is directed out to the surface of the metal layer, defects such as whiskers may occur in these metals as well. When the aforementioned metals are used instead of aluminum, the deposition temperatures and other process parameters will vary according to the metal utilized. Functionally, the deposition temperature, particularly during the deposition step S2 in FIG. 4 should be a temperature effective to allow the metal or metallic alloy to flow substantially freely and homogeneously into high aspect ration vias and over other non-planar topological features. In terms of critical ratio, the ratio of deposition temperature versus melting temperature, the critical ratio of Step S2 according to the present invention should be selected within the range of about 0.65 to about 0.95. Preferably, the critical ratio of the deposition step S2 of FIG. 4 should be selected within the range of about 0.75 to about 0.85. For example, the critical ratio of the deposition step S2 of FIG. 4 could be selected to be about 0.8. The deposition temperature, in any case, should be higher than that required to plastically deform the metal under deposition or growth conditions.

According to the embodiment of the present invention shown in FIG. 4, the generation of whiskers is suppressed or inhibited by reducing the growth rate and/or temperature of the second metal layer, after the "hot" deposition step of step S2. Best results (suppression or maximum inhibition of the generation of whiskers) occur when the growth rate of the second metal layer is reduced to zero and the temperature is reduced below the temperature at which the metal layers cease to flow and the substrate and the first and second metal layers no longer experience unacceptable thermally induced stresses. Ideally then, the wafer would be rapidly cooled to such a temperature before proceeding to the deposition of the "cap" third metal layer, as shown in FIG. 4. However, cooling the chamber in which steps SI and S2 are carried out (FIG. 4), which chamber is at a temperature of about 480–500° C. in the case wherein the first, second and third metal layers include aluminum, would take too long, would lead to an inefficient use of the multi-chamber processing system employed, would likely decrease yield and would likely raise the cost of the end product.

Figure 5:
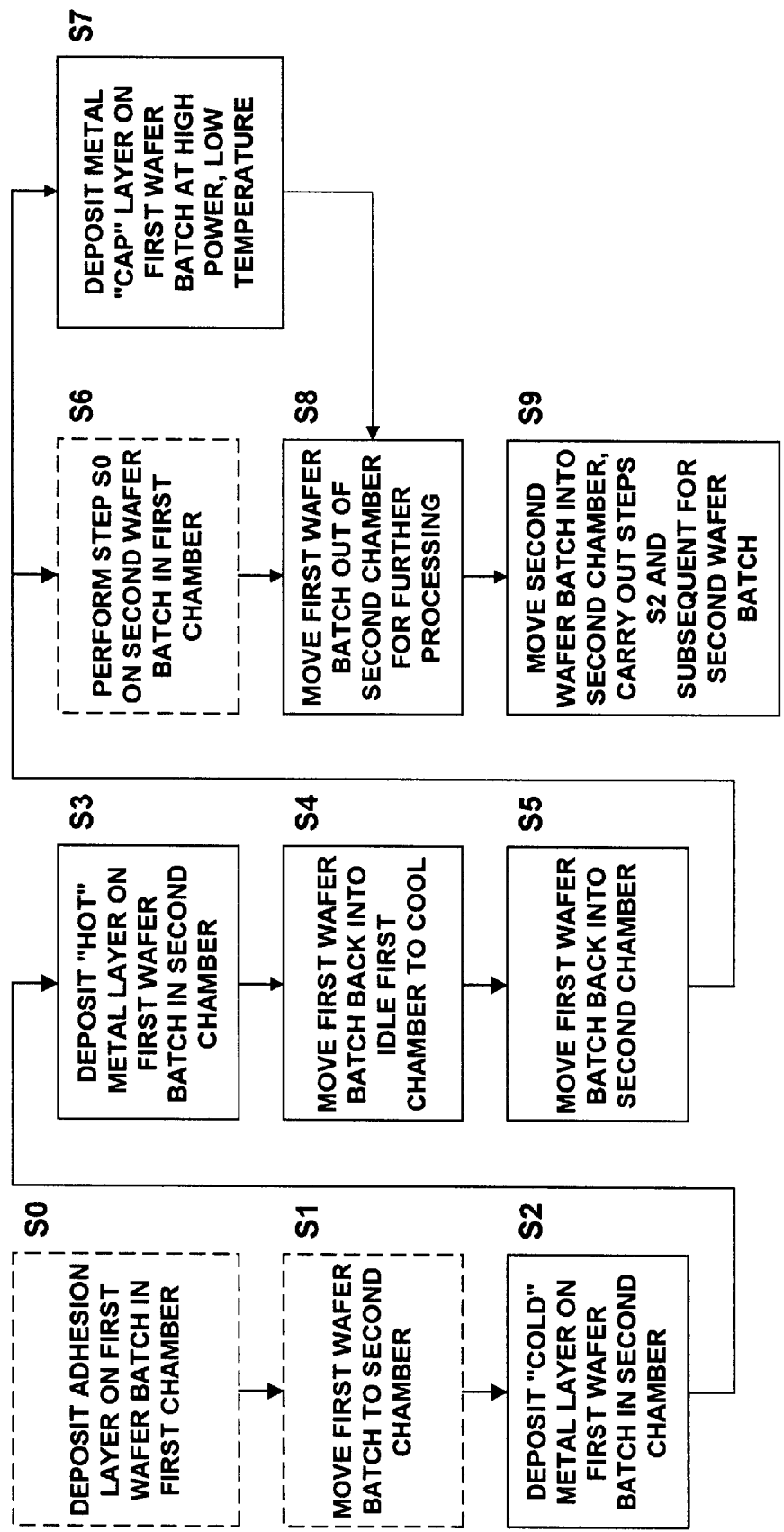
FIG. 5 shows another embodiment of the method according to the present invention.

A further embodiment of the present invention addressing this issue is shown in FIG. 5. In FIG. 5 and in the description to follow, the term "chamber" refers to process chambers of a multi-chamber sputter deposition systems such as the Endura sputtering system manufactured by Applied Materials of Santa Clara, Calif. However, other systems may be used within the context of the present invention and the present invention is not to be limited to any one kind or type of multi-chamber semiconductor processing apparatus. Also, as used herein, the term "batch" refers to a group of one or more wafers undergoing the same process step and mounted, for example, in a cassette for transport from one chamber to a next chamber in a multi-chamber deposition system or the like.

The steps in FIG. 5 in dashed lined boxes may be omitted and may not be necessary to practice the present invention. As shown in FIG. 5, an adhesion layer may be deposited on the substrate of a first batch of wafers, according to step S0. The adhesion layer may be collimated to insure that the atoms of the adhesion layer material are directed substantially perpendicularly to the wafer, thus reaching and homogeneously covering the bottom of, e.g., high aspect ratio vias. The adhesion layer may be deposited on the substrate within a first chamber of a multi-chamber processing apparatus. Thereafter, in step S1, the first wafer batch is moved to a second processing chamber of the multi-chamber processing apparatus. In step S2, a "cold" first metal layer is then deposited on the first wafer batch within the second chamber. The first metal layer may include aluminum or an aluminum-containing layer. In that case, for example, the first metal layer of step S2 may be deposited at a temperature ranging from about room temperature to about 300° C. Preferably, the first metal layer is deposited at a temperature within the range of about 50° C. and about 200° C. For example, the first metal layer may be aluminum, or an aluminum alloy containing, for example, 0.5% of copper and deposited at a temperature of about 100° C.

In step S3, a "hot" second metal layer is then deposited on the first wafer batch, still within the second chamber. The second metal layer is preferably deposited at a relatively higher temperature than the temperature at which first metal layer was deposited in step S2. In other words, the critical ratio of deposition temperature to melting temperature for the selected second metal layer is closer to unity than is the critical ratio of the first metal layer deposited in step S2. For example, in the case wherein the first and second layers include aluminum or an aluminum containing alloy, the first and the second metal layers may be deposited at a temperature ranging from about 350° C. to about 550° C. In this case, the second metal layer is preferably deposited at a temperature ranging from about 400° C. to about 500° C. For example, the second metal layer may be deposited at a temperature of about 480° C. To do this, backside gas pressure may be applied on the pedestal on which the wafer rests, thereby causing the surface temperature of the wafer surface or the temperature within the second chamber to rise rapidly because of high thermal conductivity between the wafer backside and the pedestal.

In step S4, instead of reducing the growth rate and/or the temperature of the first wafer batch, as disclosed relative to FIG. 4, the embodiment of the present invention shown in FIG. 5 provides for moving the first wafer batch into an idle, preferably cool and preferably adjacent chamber. The first chamber in which the adhesion layer in step S0 may be such a chamber, as it may now be idle, and may be sufficiently cool for such purpose. However, any idle and preferably cool chamber may be used for such purpose within the context of the present invention.

Moving the first wafer batch into an idle and preferably cool chamber accomplishes several goals. At the outset, moving the first wafer batch out of the second deposition chamber effectively reduces the growth rate of the second metal layer to zero or substantially to zero. Therefore, the maximum benefit, in terms of whisker suppression or inhibition, of reducing the growth rate is achieved, as the growth rate of the second metal layer cannot be reduced further than a zero or substantially zero growth rate. However, it has been found, according to the present invention, that the generation of whiskers is a relatively weak function of the growth rate but is a relatively strong function of the temperature, i.e. it increases exponentially with increasing deposition temperature. Moving the first wafer batch into an idle and preferably cool chamber also addresses the temperature dependency of whisker generation. Indeed, the temperature within the first chamber may now be below 250° C., which will effectively inhibit the generation of whiskers through material-extrusion mechanisms and other similar defects. More preferably still, the ambient temperature within the idle chamber (such as the first chamber, for example) is below about 150° C. For example, the ambient temperature within the first chamber or other idle chamber in which the first wafer batch is moved is within the range of about room temperature to about 100° C.

After the first wafer batch has been moved into an idle and preferably adjacent chamber, such as the first chamber, and has cooled to a temperature at least below about 250° C., and preferably below about 150° C. and most preferably within the range of about room temperature to about 100° C., the first wafer batch is moved to another chamber, such as the second chamber for example, as shown in step S5. Now that the chamber used to cool the first wafer batch in step S4 is once again idle, a second batch of wafers may be processed therein, and step S0 may be performed on the second batch, as shown in step S6. That is, an adhesion layer may be deposited on the second wafer batch within the first chamber. Alternatively, the time during which the first wafer batch is cooling in the first chamber, in step S4, may be used to deposit a "cold" first metal layer and/or a "hot" second metal layer on another wafer batch, to make optimal use of available chamber resources. Step S7 may be performed or started simultaneously with step S6. In step S7, after the growth rate of the second metal layer of the first wafer batch has been reduced to about zero and the temperature of the second metal layer of the first wafer batch has been suitably reduced as disclosed above, a third metal layer, a so-called "cap" layer, may be deposited on the second metal layer of the first wafer batch, preferably at high power and at a lower temperature than the temperatures in steps S2 and S3. As the power in the second chamber is high, the third metal layer may be formed within a short period of time, and the first wafer batch will not unacceptably heat up, thus keeping the generation and size of whiskers and other undesirable particles to a minimum.

The first wafer batch may now be moved from the second chamber for further processing, as shown in FIG. 5 at step S8. As the adhesion layer deposition step S6 is likely finished for the second wafer batch in the first chamber, the second wafer batch may now be moved into the second chamber for deposition of the first and second metal layers, as shown in step S9. Thereafter, the process described above may repeat itself. It is to be understood that the present invention is not to be limited to a method wherein the idle chamber used to cool the wafer prior to the deposition of the third metal layer is the chamber in which the adhesion layer is deposited. Indeed, any idle and preferably cool chamber may be used for this purpose. According to the present invention, therefore, the generation and size of whiskers and other similar defects is inhibited and may be suppressed altogether without, however, adding a single extra processing step. Indeed, the present invention allows the generation of whiskers to be inhibited or suppressed while making most efficient use of available resources, such as an idle and preferably adjacent chamber of a multi-chamber processing apparatus. Indeed, according to the present invention, an adhesion layer (or any other desired processing step) may be carried out on a second wafer batch while the third "cap" layer is deposited, thus concurrently readying the second wafer batch for further processing. Other possible chamber usage combinations exist and will occur to those of skill in this art, and all such combinations should be included within the scope of the present invention.

The first, second and third metal layers may include aluminum or an aluminum containing alloy, such as an aluminum alloy containing 0.5% of a metallic impurity, such as copper for example. Other metallic impurities may be added to the aluminum-containing alloy in place of or in addition to copper, to produce ternary, quaternary or higher order compounds. In addition, the percentage of impurity may be varied within the context of the present invention as long as the alloy utilized maintains the desirable electrical characteristics. Alternatively, the first, second and/or third metal layers may include one or more elements selected from the group consisting of aluminum, copper, tungsten, molybdenum, tantalum, titanium and alloys thereof. In that case, the temperatures and other process parameters may be different and should be suitably adjusted according to the present invention.

In its simplest form, the present invention includes a step of interrupting the deposition of first and second layer forming steps to allow the first and second metal layers to cool before any third metal layer is deposited at high power and at a relatively low temperature. For example, in the embodiment illustrated in FIG. 5, the first wafer batch may be moved back into the second chamber for deposition of the third metal layer, even though the second chamber may be a relatively elevated temperature. Indeed, at high power, the third metal layer may be quickly deposited. As the pedestal's heater or the wafer's backside pressure, within the second chamber, is preferably turned off, the first and second metal layers may not have time to heat up to a temperature favoring the formation of whiskers and other similar defects.

A further embodiment of the present invention is described below. In this embodiment, the adhesion layer includes collimated titanium and the first, second and third metal layers include an aluminum containing alloy, such as an aluminum alloy containing about 0.5% of copper.

According to a first step of this embodiment of the present invention, a layer of about 500 angstroms (hereafter Å) is deposited on a $SiO_2$ substrate in a first chamber at about 1.2 milliTorr pressure, at a power of about 18 kW and at a temperature of about 40° C. In a second chamber, a "cold" first metal layer is then deposited on the adhesion layer for about 13 seconds to a thickness of about 2,500 Å, at a pressure of about 1.6 milliTorr, at about 11.7 kW of power and at a temperature of about 50° C. to about 150° C. In the same second chamber, a "hot" second metal layer is then deposited on the first metal layer for about 150 seconds to about 200 seconds to a thickness of about 1,500 Å at about 4.8 milliTorr of pressure and at low power, at a power of about 520 W and at an elevated temperature in the range of about 450° C. to about 500° C., such as, for example, 480° C.

At this juncture in the processing, should the "cap" third metal layer be immediately deposited, whiskers and other like defects would likely be generated at an unacceptable size and density. However, according to the teachings of the present invention, the processing,if interrupted and the first and second metal layers allowed to cool for about 0–120 seconds, for example, preferably in an idle, room temperature chamber at about base pressure. The time for the wafer's transport to the idle chamber itself may sufficiently cool the first and second metal layers. The idle chamber may be at any temperature up to about 400° C. for aluminum containing alloys, although a lower temperature, such as temperatures below about 300° C., it is believed, will yield better results (i.e., fewer whiskers generated and of smaller size). Preferably still, the idle chamber should be at a temperature less than about 250° C. Using the now idle first chamber for this purpose is optimal, as the heater within the first chamber is preferably maintained at about 40° C.

The "cap" third metal layer may now be deposited onto the second metal layer. For this purpose, the wafer or wafer batch is preferably transferred back to the second chamber (or any other suitable chamber). The deposition of the "cap" third layer is carried on while the backside gas pressure therein is turned off. Therefore, although the temperature within the second chamber may be about 480° C. from the previous deposition step, heat transfer from the pedestal to the wafer backside is very poor, and the wafers in the second chamber will be heated mainly by the discharge plasma. This "cap" third metal layer may be deposited to a thickness of about 4,000 Å for 20 seconds at about 1.6 milliTorr and at a power of about 11.7 kW. During this time, the first and second metal layers may heat up from a temperature equal to about the ambient temperature in the first chamber to about 150° C. to about 200° C. However, this temperature is believed to be sufficiently low as to suppress or inhibit the formation the formation (and reduce the size) of whiskers and other like defects. The thickness of the first, second and third metal layers may vary from those disclosed above.

The present invention may be used to form metal layers in active electronic components (e.g. integrated circuit chips, transistors and diodes) and passive components (e.g. resistors, capacitors and inductors). The present invention may also be used to form stacked metal layers in other types of devices, such as lead frames, medical devices and flat panel displays, or any device or structure that would benefit from smooth, substantially defect free surfaces.

While the foregoing detailed description has described preferred embodiments of the present invention, it is to be understood that the above description is illustrative only and not limiting of the disclosed invention. For example, the first and second metal layers may include elements not disclosed herein without, however, departing from the scope and spirit of the present invention. Other modifications may occur to those of skill in this art. For example, the process parameters disclosed herein may be varied to address the particular design constraints of the application at hand. Thus, the present invention to be limited only by the claims as set forth below.

What is claimed is:

1. A method of metallizing a substrate, comprising the steps of:

depositing a first metal layer;

depositing a second metal layer over said first metal layer under conditions of temperature and pressure such that said second metal layer flows substantially freely and homogeneously over non-planar topological features of said substrate and first metal layer;

reducing a growth rate of said second metal layer and reducing a temperature of said second metal layer to below a point where the second metal layer ceases to flow and wherein the growth rate of said second metal layer is reduced substantially to zero; and depositing a third metal layer over said second metal layer.

2. The method of claim 1, wherein the temperature of said second metal layer during said second depositing step, prior to reduction of growth rate, is between about 0.65 and 0.95 of the melting temperature of the metal of said second layer.

3. The method of claim 1, wherein during said reducing step, the growth rate of said second layer is reduced substantially to zero.

* * * * *